(12) United States Patent
Caldwell et al.

(10) Patent No.: US 8,227,774 B2
(45) Date of Patent: Jul. 24, 2012

(54) METHOD AND SYSTEM FOR FEATURE FUNCTION AWARE PRIORITY PRINTING

(75) Inventors: Brian N. Caldwell, Milton, VT (US); Emily E. F. Gallagher, Burlington, VT (US); Steven C. Nash, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 245 days.

(21) Appl. No.: 12/683,720

(22) Filed: Jan. 7, 2010

(65) Prior Publication Data

US 2011/0165502 A1 Jul. 7, 2011

(51) Int. Cl.
*G03F 1/00* (2006.01)
*G03F 9/00* (2006.01)
*B01J 19/08* (2006.01)

(52) U.S. Cl. ............. 250/492.22; 250/492.3; 250/492.2; 430/5; 716/52; 716/54; 700/121

(58) Field of Classification Search ............... 250/492.2, 250/492.22, 492.3; 716/52, 54; 700/121; 430/5
See application file for complete search history.

(56) References Cited

U.S. PATENT DOCUMENTS

| | | | |
|---|---|---|---|
| 5,260,579 A | 11/1993 | Yasuda et al. | |
| 6,677,592 B2 | 1/2004 | Chen | |
| 6,768,125 B2 | 7/2004 | Platzgummer et al. | |
| 6,781,140 B1 | 8/2004 | King et al. | |
| 7,249,342 B2 * | 7/2007 | Pack et al. | 716/52 |
| 7,276,714 B2 | 10/2007 | Platzgummer et al. | |
| 7,496,885 B1 * | 2/2009 | Caldwell et al. | 716/52 |
| 7,784,016 B2 * | 8/2010 | Pack et al. | 716/52 |

* cited by examiner

*Primary Examiner* — Nikita Wells
(74) *Attorney, Agent, or Firm* — Richard Kotulak; Roberts Mlotkowski Safran & Cole, P.C.

(57) ABSTRACT

A method and system for photomask pattern generation is provided, and more specifically, a method and system for feature function aware priority printing is provided. The method of printing a photolithographic mask includes fracturing mask design data into write shapes that are multiples of a spot size and passing fractured mask design data to a write tool. Additionally, the method includes writing one or more non-critical shapes according to one or more time-saving rules.

22 Claims, 8 Drawing Sheets

METHOD AND SYSTEM FOR FEATURE FUNCTION AWARE PRIORITY PRINTING

FIELD OF THE INVENTION

The present invention generally relates to a method and system for photomask pattern generation, and more specifically, to a method and system for feature function aware priority printing.

BACKGROUND

A photomask is an opaque plate with holes or transparencies that allow light to pass through in a defined pattern. A photomask is commonly used in photolithography. The image for the photomask may originate from a computerized data file. For example, this data file may be converted to a series of polygons and written onto, e.g., a square fused quartz substrate covered with a layer of chrome using a photolithographic process. Lithographic photomasks are typically transparent fused silica blanks covered with a pattern defined with a chrome metal absorbing film.

In a photolithographic process, a set of photomasks, each defining a pattern layer in integrated circuit fabrication, is fed into a photolithography stepper or scanner and individually selected for exposure. More specifically, optical lithography, is a process used in microfabrication to selectively remove parts of a thin film or the bulk of a substrate. Optical lithography uses light to transfer a geometric pattern from the photomask to a light-sensitive chemical photo resist (or "resist") on the substrate. A series of chemical treatments then engraves the exposure pattern into the material underneath the photo resist. In complex integrated circuits, for example a modern CMOS, a wafer will go through the photolithographic cycle up to fifty times.

In order to create a photomask, a laser beam (laser writer) or a beam of electrons (e-beam writer) may be used to expose the photomask pattern defined in the data file by traveling over the surface of the photomask substrate in either a vector or raster scan manner. Where the photoresist on the photomask is exposed, the chrome can be etched away, leaving a clear path for the light in the stepper/scanner systems to travel through. Electron beam pattern generation offers advantages of resolution, corrections, and overall quality. However, e-beam writers are expensive and slow, which leads to increased costs for resulting photomasks.

Accordingly, there exists a need in the art to overcome the deficiencies and limitations described hereinabove.

SUMMARY

In a first aspect of the invention, a method of printing a photolithographic mask includes fracturing mask design data into write shapes that are multiples of a spot size and passing fractured mask design data to a write tool. Additionally, the method includes writing one or more non-critical shapes according to one or more time-saving rules.

An additional aspect of the invention includes a system implemented in hardware. The system comprises a non-critical structure determination tool operable to identify one or more non-critical structures in mask design data. Additionally, the system comprises a mask data fracturing tool operable to fracture the mask design data into write shapes that are multiples of a spot size. Furthermore, the system comprises an electron beam (e-beam) control tool operable to pass fractured mask design data to an e-beam tool with instructions to write the one or more non-critical shapes according to one or more time-saving rules.

In an additional aspect of the invention, a computer program product comprises a computer usable storage medium having readable program code embodied in the storage medium. The computer program product includes at least one component operable to fracture mask design data into write shapes that are multiples of a spot size. Additionally, the at least one component is operable to identify one or more non-critical shapes from the mask design data. Furthermore, the at least one component is operable to pass fractured mask design data to an electron beam (e-beam) write tool. The at least one component is also operable to instruct the writing of the one or more non-critical shapes according to one or more time-saving rules.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
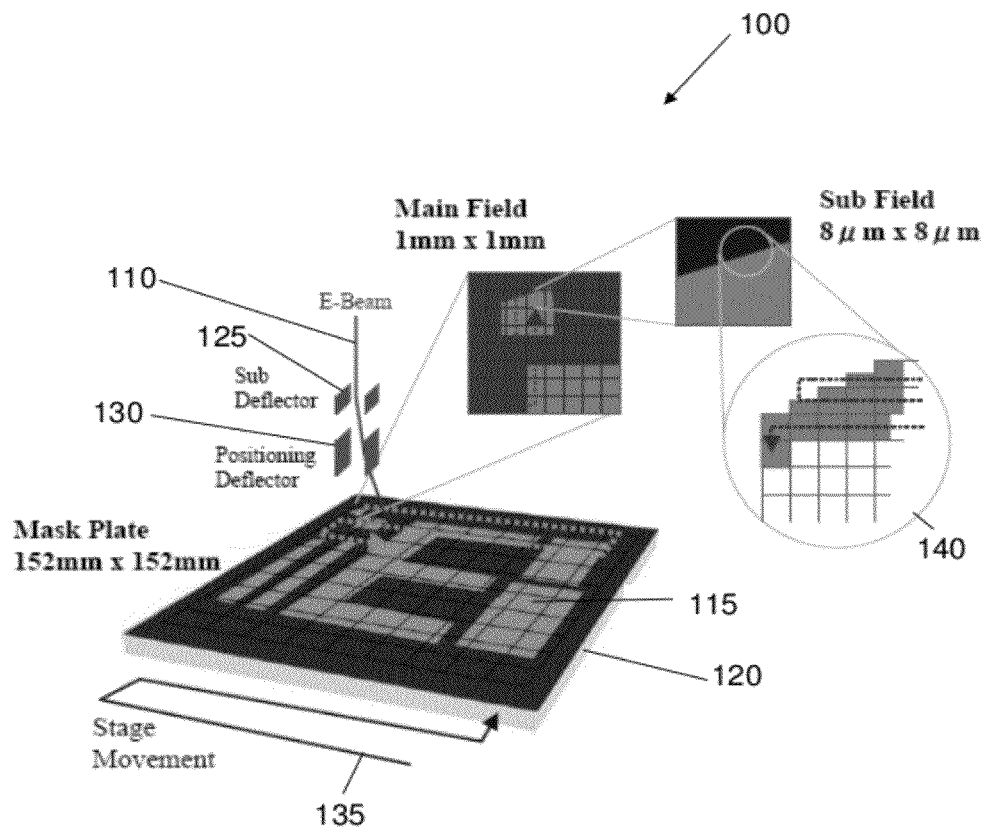
FIG. 1 shows an exemplary e-beam pattern generation writing strategy.

The present invention generally relates to a method and system for photomask pattern generation, and more specifically, to a method and system for feature function aware priority printing. In embodiments, the present invention comprises a method and system for reducing e-beam write time.

Electron beam lithography (often abbreviated as e-beam lithography) is the practice of scanning a beam of electrons in a patterned fashion across a surface covered with a film (called a resist), e.g., "exposing" the resist. The beam of electrons (or e-beam) selectively remove, for example, either exposed or non-exposed regions of the resist, e.g., "developing" the resist. The e-beam creates structures in the resist that can subsequently be transferred to a substrate material, e.g., by etching. Electron beam lithography may be used in manufacturing integrated circuits.

An advantage of electron beam lithography is its ability to make features with high resolution, e.g., in the nanometer regime. Additionally, electron beam pattern generation offers advantages of corrections, and overall quality. On the other hand, a drawback of electron beam lithography is throughput, i.e., the very long time it takes to expose, e.g., an entire silicon wafer or glass substrate. For example, currently, e-beam lithography is not suitable for high-volume wafer manufacturing because of its limited throughput. That is, the serial nature of electron beam writing makes for very slow pattern generation compared with a parallel technique like photolithography, in which the entire surface is patterned at once. For example, with conventional photomask pattern generation, a single beam vector scan may be used for 90 nm layers. However, such a conventional photomask pattern generation is proportional to the number of shapes and may require, for example, six to fifteen hours or more of processing time.

Additionally, a long exposure time, for example, may leave, e.g., a photomask vulnerable to beam drift or instability, which may occur during an exposure. Also, the turn-around time for reworking or re-design may be lengthened unnecessarily, for example, if the pattern is not being changed the second time. Moreover, currently with e-beam lithography, all features are made with the assumption that all of the features have the same required tolerance. Due to, the associated low throughput and high costs, for example, electron beam lithography has found limited usage.

According to aspects of the invention, features of the photomask may require different levels of e-beam tolerance and/or requirements. For example, in embodiments, a photomask may have features requiring two levels of e-beam tolerance, e.g., lower e-beam tolerance features (or "non-critical features") and higher e-beam tolerance features (or "critical features"), with additional levels of e-beam tolerances contemplated by the invention. According to aspects of the invention, the non-critical and critical features are identified. In embodiments, information on data levels of the photomask that are non-critical (e.g., features that can be written using lower e-beam tolerance) and data levels of the photomask that are critical (e.g., features that can be written using higher e-beam tolerance) are passed to the e-beam tool. The e-beam tool utilizes write options for the lower tolerance and/or general requirement features (e.g., non-critical features) that are faster, e.g., at the expense of pattern quality. Additionally, in embodiments, the e-beam tool may choose write options for the critical features.

Implementing the present invention, for example, by choosing lower tolerance write options for those features of the photomask (e.g., non-critical features) that can be written with a lower tolerance, photomasks can be produced faster and less expensively using faster and/or less costly methods to produce such lower tolerance features. In embodiments, a software tool can identify and flag "non-critical" shapes in the photomask data, e.g., post fracture.

FIG. 1 shows an exemplary e-beam pattern generation writing strategy 100. With e-beam pattern generation, electrons 110 are used to expose, for example, rectangular shapes 115 in a photomask plate (or resist) 120. As shown in FIG. 1, the exemplary photomask plate 120 is 152 mm×152 mm, with other photomask plate sizes contemplated by the invention. The energy applied in each shape 115 is the dose. A maximum size of the rectangle shape 115 (or spot size) is, for example, typically 1 um×1 um, with other maximum sizes contemplated by the invention. The smallest size of the rectangular shapes 115 (or spot size) may be limited by the e-beam exposure tool. Multiple rectangles 115 are placed next to each other to create larger or more complex shapes in the photomask plate 120.

As shown in FIG. 1, an e-beam 110 is deflected, for example, by a sub deflector 125 and a positioning deflector 130 as the photomask plate 120 is moved relative to the e-beam 110 in a stage movement 135, for example, as shown in inset 140. By applying e-beam energy, using such a conventional method, the resist shape is created on the photomask plate 120.

However, e-beam writing strategies involve time-consuming write choices. For example, a smaller spot size may be used to generate resist images, which improves cross field critical dimension uniformity. On the other hand, a small spot size increases a shot count, or number of times an e-beam energy is applied to the photomask plate 120. That is, while a small spot size may be used to improve cross field critical dimension uniformity, this improvement will require a higher shot count, and thus, longer processing times.

Additionally, settling time is a consideration for e-beam writing. Settling time is a time used to allow a system to stabilize between e-beam energy application to adjacent shots. Thus, an increase in shot count, e.g., due to a smaller spot size, will increase the total settling time necessary for sufficient stabilization after e-beam deflection.

Multi-pass writing is another consideration for e-beam writing. Multi-pass writing may improve image placement and spot and field stitching, e.g., line edge roughness. However, as multiple passes are being performed, write time will increase. Thus, while each of these write choices (e.g., smaller spot sizes, increased settling time and/or multi-pass writing) may improve print quality, such improved print quality comes at a lower throughput rate, and thus, with higher associated costs.

Figure 2:
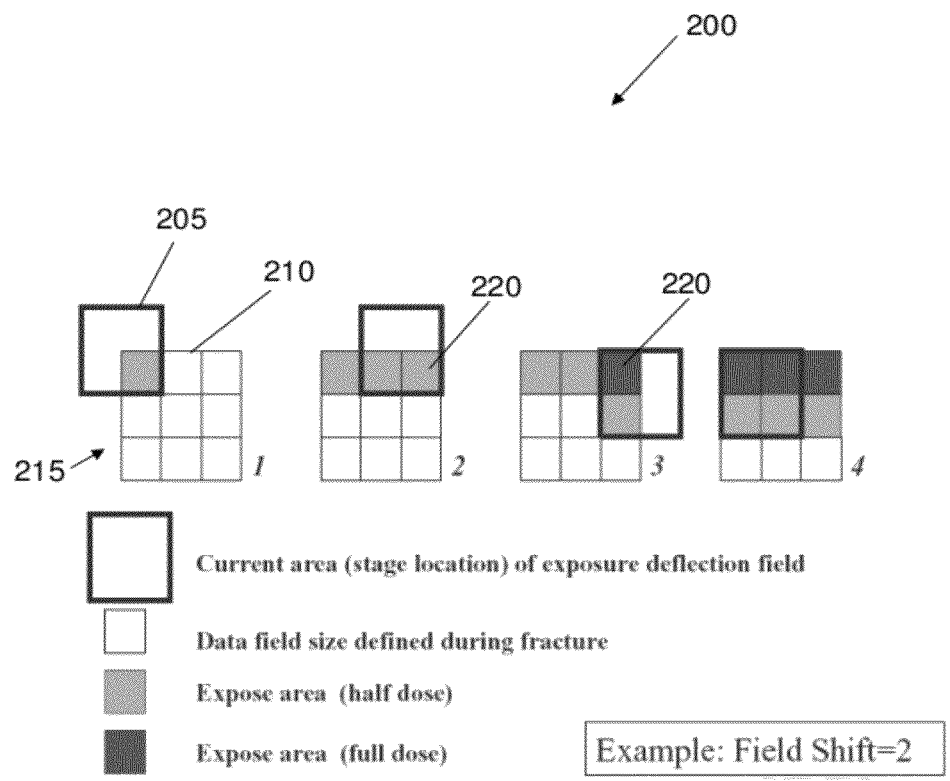
FIG. 2 illustrates an exemplary e-beam writing process.

FIG. 2 illustrates an exemplary e-beam writing process 200. As shown in FIG. 2, a current area of the exposure deflection field 205 is four times the size of the defined data field size 210 (which is defined, for example, during fracture). Thus, as shown in FIG. 2, during stage one, the e-beam tool writes data to the photomask using a quarter exposure deflection field. That is, only one quarter of the exposure deflection field 205 is used to write to the photomask. Additionally, as shown in FIG. 2, with this example, during stage one the exposed area receives a half dose. During stages two and three, the e-beam tool writes data to the photomask using a half deflection field. During stage four, the e-beam tool writes data to the photomask using the entire exposure deflection field 205. As shown in FIG. 2, as the exposure deflection field 205 shifts by two data-fields (or two of the defined data fields 210), the example of FIG. 2 has a field shift value of two.

Additionally, the example of FIG. 2 utilizes a multiple pass approach. That is, as shown in FIG. 2, exposed areas may be subject to multiple doses of energy in separate stages. For example, as shown in stage two, the upper right data field 220 is subject to a first e-beam exposure, which provides a half dose to the data field 220. Subsequently, as shown in stage three, the upper right data field 220 is subject to a second e-beam exposure, which provides a half dose to the data field 220 (and thus, renders data field 220 fully dosed).

Thus, with the example of FIG. 2, as at least a smaller spot size and multi-pass writing are utilized, the writing of the entire photomask will require longer writing times. The longer writing times, in turn, will increase associated costs.

In accordance with aspects of the invention, for example, in order to reduce e-beam writing time, non-critical photomask shapes may be identified and written according to one or more time-saving rules. In embodiments, such rules may include utilizing a lower resolution, a large spot size, a single pass and/or reduced settling time. For example, with regard to utilizing a large spot size, data fields may be fractured into write shapes that are multiples of the spot size, such that no half spots or quarter spots are utilized in photomask pattern creation for the non-critical features. Additionally, with regard to the reduced settling time, with non-critical shapes, a reduced settling time may be utilized because image placement may be of less concern with such non-critical shapes. Moreover, each of these time saving approaches (e.g., large spot, single pass and/or reduced settling time) are not disruptive to the normal spot-by-spot formation e-beam writing approach.

Additionally, in embodiments, the non-critical shapes may be written last, because placement and drift may be less important with the non-critical features. Also, by writing such non-critical shapes last, critical feature placement is consequently improved. In embodiments, non-critical photomask shapes/features may include, for example, fill shapes, pads, guard rings, photomask bar codes, photomask metrology alignment, phase metrology, borders and/or test pads, amongst other non-critical shapes/features contemplated by the invention.

Figure 3:
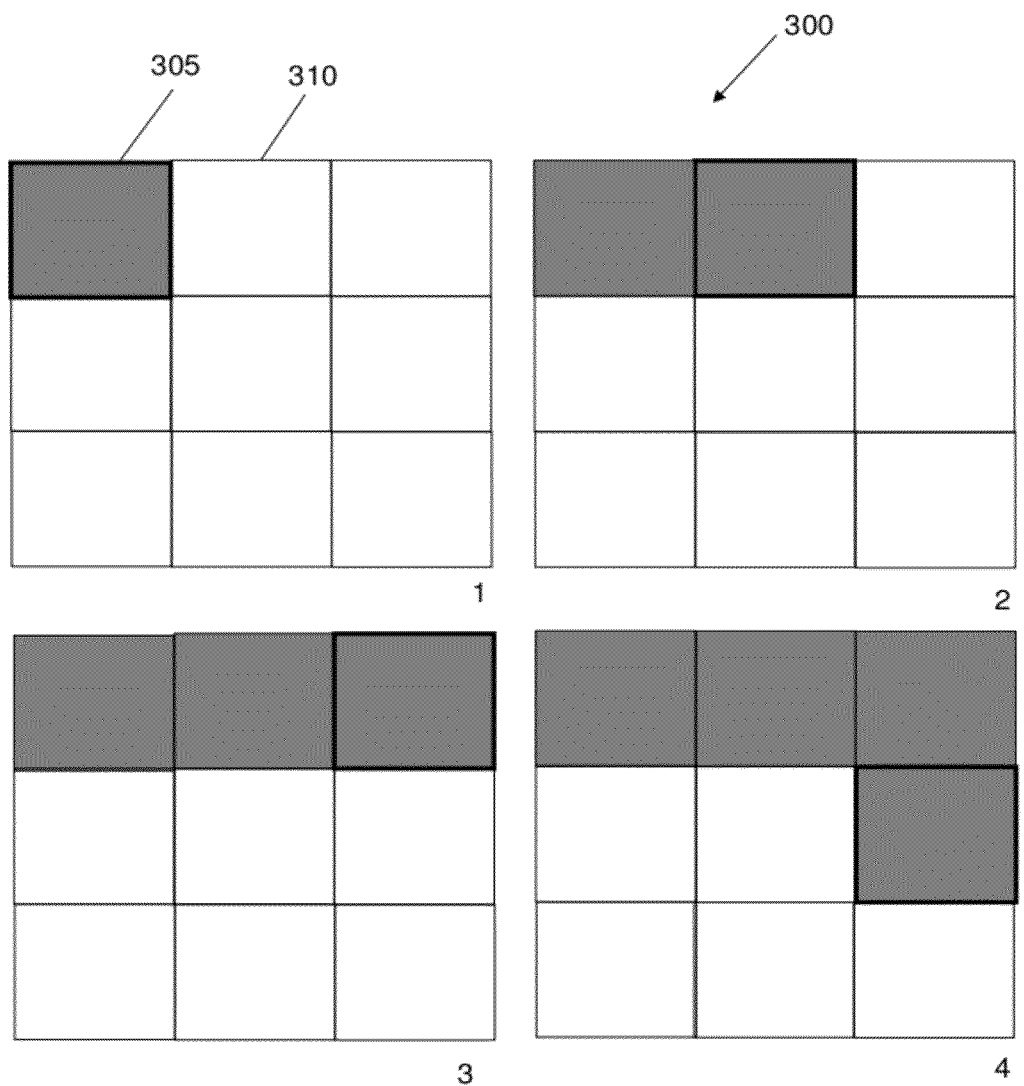
FIG. 3 shows an exemplary e-beam writing process in accordance with aspects of the invention.

FIG. 3 shows an exemplary e-beam writing process 300 in accordance with aspects of the invention. As shown in FIG. 3, a larger spot size is used to generate images in the photomask. Additionally, the data has been fractured into write shapes 210 that are multiples of the spot size. For example, with FIG. 3, the write shapes 310 and the spot size 305 are the same size. Furthermore, as shown in FIG. 3, the exemplary writing process 300 utilizes a single pass approach (as opposed to a multi-pass approach). That is, as the writing process 300 proceeds from stage one to stage four, no write shapes 310 are dosed more than once. Thus, by implementing the present invention, using one or more time-saving approaches for non-critical features, e-beam writing time can be reduced, and consequently, cost savings can be realized.

Flow Diagram

Figure 4:
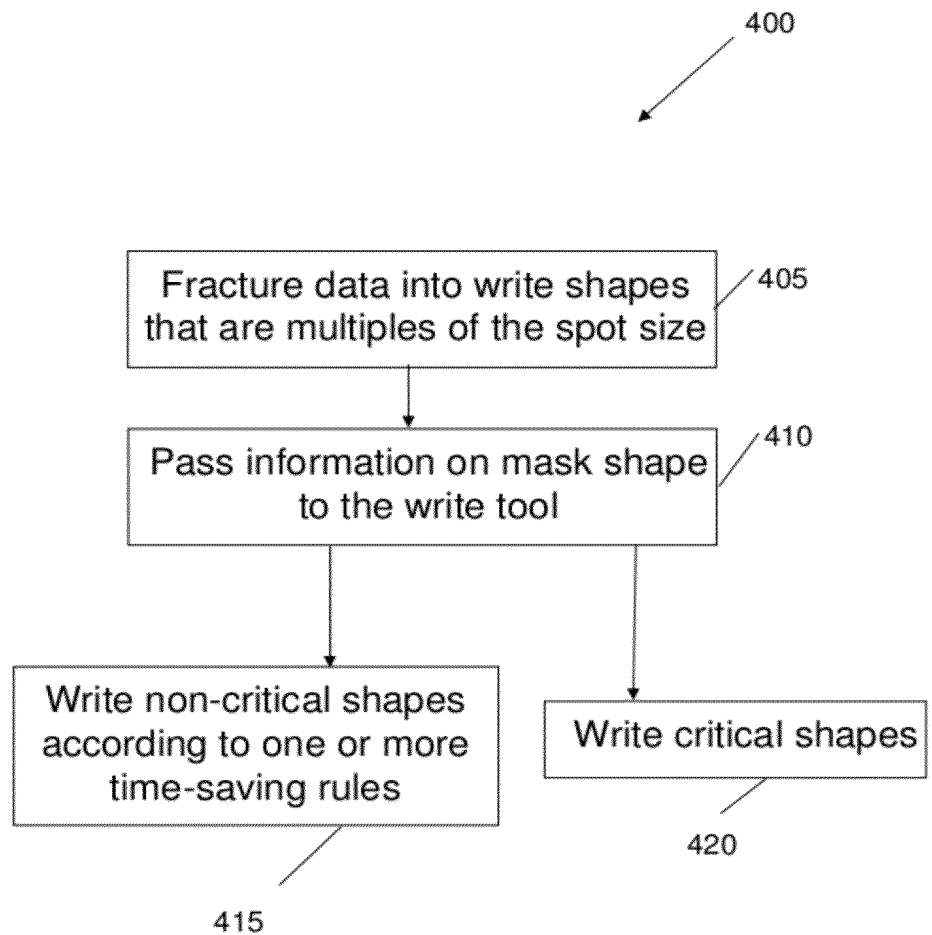
FIG. 4 shows an exemplary flow diagram for performing aspects of the present invention.

FIG. 4 shows an exemplary flow diagram 400 for performing aspects of the present invention. The steps of FIG. 4 may be implemented in the environment of FIG. 8, for example. The flow diagram may equally represent a high-level block diagram or a swim-lane diagram of the invention. The flowchart and/or block diagram in FIG. 4 illustrates the architecture, functionality, and operation of possible implementations of systems, methods and computer program products according to various embodiments of the present invention. In this regard, each block in the flowchart, block diagram or swim-lane diagram may represent a module, segment, or portion of code, which comprises one or more executable instructions for implementing the specified logical function(s). It should also be noted that, in some alternative implementations, the functions noted in the blocks may occur out of the order noted in the figure. For example, two blocks shown in succession may, in fact, be executed substantially concurrently, or the blocks may sometimes be executed in the reverse order, depending upon the functionality involved. Each block of each flowchart, and combinations of the flowchart illustration can be implemented by special purpose hardware-based systems that perform the specified functions or acts, or combinations of special purpose hardware and computer instructions and/or software, as described above. Moreover, the steps of the flow diagram may be implemented and executed from either a server, in a client server relationship, or they may run on a user workstation with operative information conveyed to the user workstation. In an embodiment, the software elements include firmware, resident software, microcode, etc.

In embodiments, a service provider, such as a Solution Integrator, could offer to perform the processes described herein. In this case, the service provider can create, maintain, deploy, support, etc., the computer infrastructure that performs the process steps of the invention for one or more customers. These customers may be, for example, any business that uses technology. In return, the service provider can receive payment from the customer(s) under a subscription and/or fee agreement and/or the service provider can receive payment from the sale of advertising content to one or more third parties.

Furthermore, the invention can take the form of a computer program product accessible from a computer-usable or computer-readable medium providing program code for use by or in connection with a computer or any instruction execution system. The software and/or computer program product can be implemented in the environment of FIG. 8. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

As shown in FIG. 4, at step 405, data is fractured into write shapes that are multiples of the spot size. For example, in embodiments, the data may be fractured into write shapes of 1 um×1 um, with other spot sizes contemplated by the invention. As such, in embodiments, no half spots or quarter spots may be necessary to create the non-critical features of the photomask shape. At step 410, the fractured photomask shape data is passed to the write tool (e.g., e-beam tool). In embodiments, for example, numerically controlled (NC) data may be used to pass the photomask shape data to the write tool. At step 415, the e-beam tool writes the non-critical shapes according to one or more time-saving rules (e.g., larger spot size, single pass and/or reduced settling time). At step 420, the e-beam tool writes the critical shapes of the photomask. As illustrated in FIG. 4, steps 415 and 420 may be performed in parallel. As noted above, however, in embodiments, step 420 may be performed before step 415.

Figure 5:
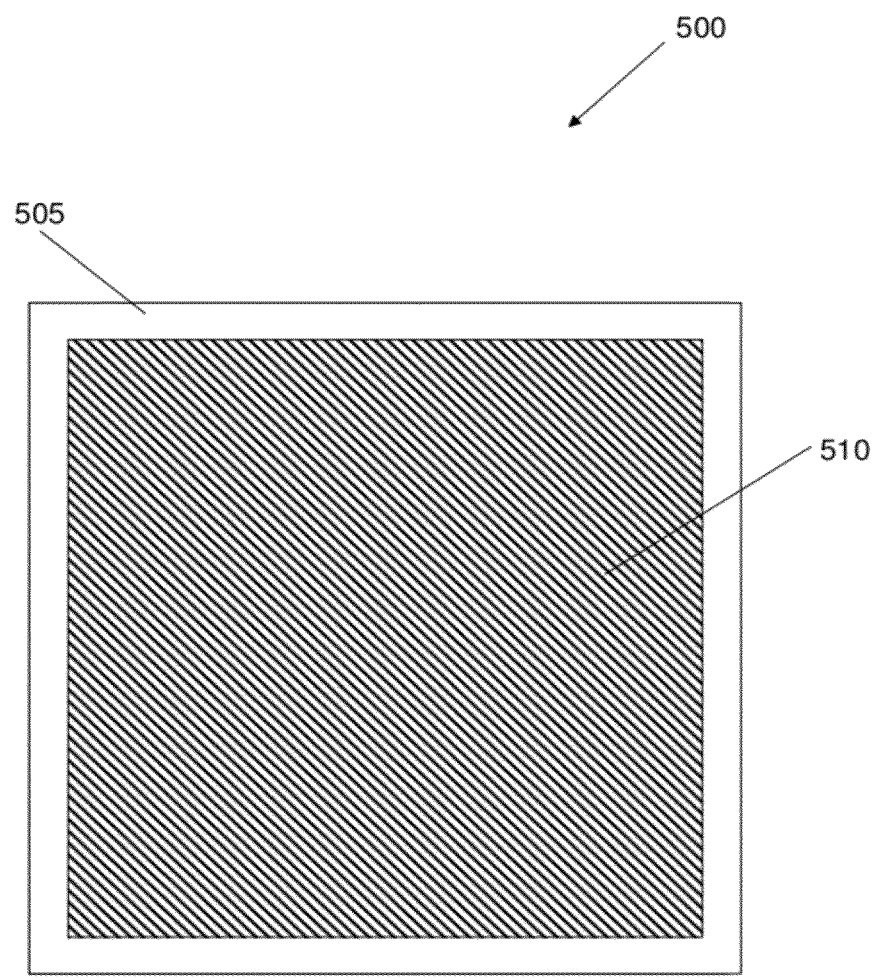
FIGS. 5-7 show exemplary processing steps in accordance with aspects of the invention.
Figure 6:
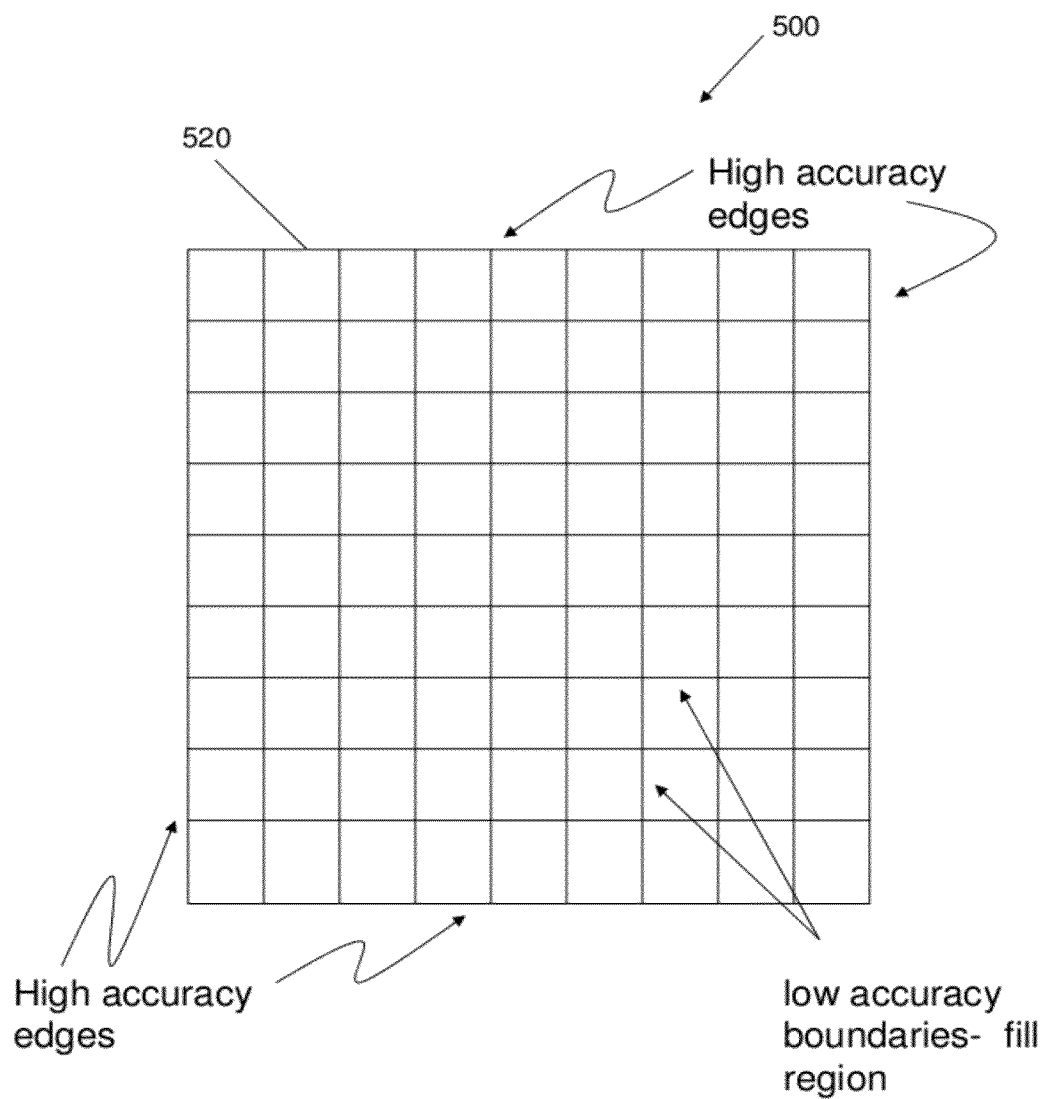
Figure 7:
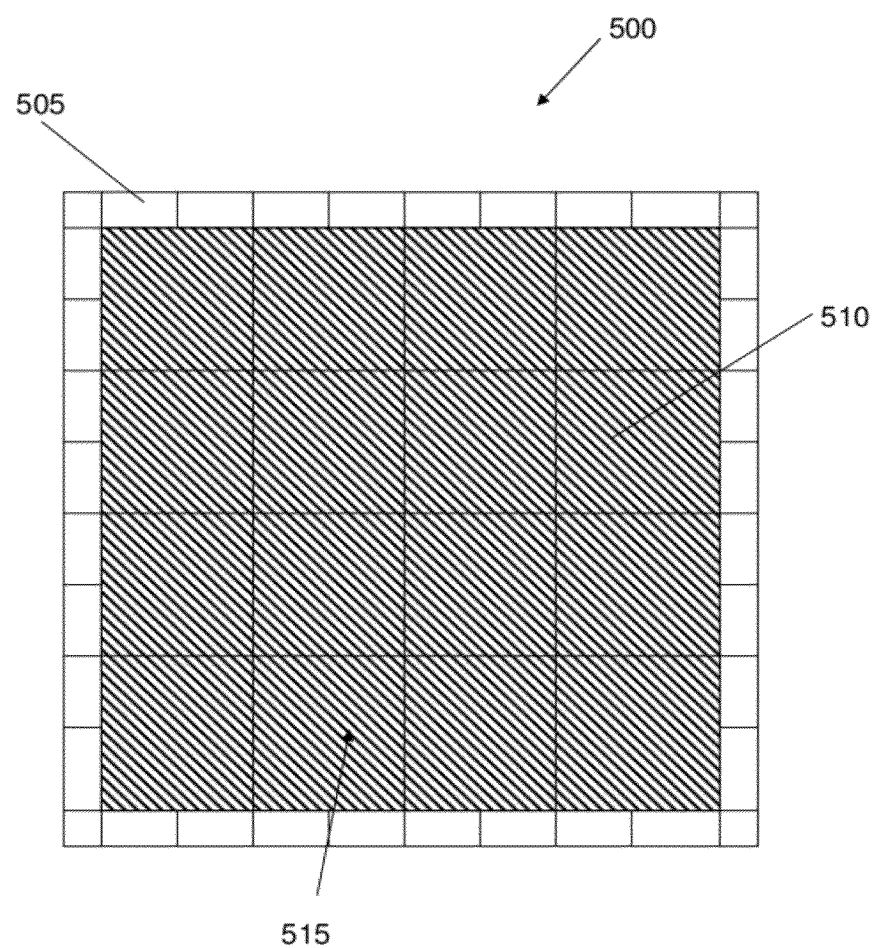

FIGS. 5-7 show exemplary processing steps in accordance with aspects of the invention. As shown in FIG. 5, the exemplary process begins with a photomask shape 500, which in this example is a 9 um×9 um square. The photomask shape 500 is output to the e-beam writing tool. As should be understood by those of ordinary skill in the art, while the photomask shape 500 is illustrated in FIG. 5 without any features (in order to facilitate an understanding of the present invention), such photomask shapes would also include the features. Moreover, with this example, the fracture data differentiates two distinct areas in the data flow. That is, photomask shape 500 includes region 505 having critical features, which requires a higher e-beam resolution. Additionally, photomask shape 500 includes region 510 having non-critical features, which can be written with one or more time-saving approaches of the present invention (for example, a lower e-beam resolution, larger spot size, single pass and/or shorter settling times).

In embodiments, as shown in FIG. 6, the e-beam writing tool, for example, breaks the photomask shape 500 into eighty-one full size shots 520. That is, the shot size is 1 um×1 um and the photomask shape 500 is a 9 um×9 um square. As such, with this example, the photomask shape 500 includes eighty-one full size shots 520. However, as should be understood, the invention contemplates other photomask shapes and other shot sizes. Each shot 520 has equal resolution and positional accuracy, as well as, same dwell times. As shown in FIG. 6, however high accuracy (for critical features) is only needed on outside edges. That is, with this example, the outside edges include critical features, whereas the central region of the photomask 500 includes non-critical features, as also indicated in FIG. 5.

As shown in FIG. 7, in accordance with aspects of the invention, a non-critical structure determination tool, for example, can tag areas of the photomask 500 for different exposure conditions. The e-beam tool may write region 505 with one or more exposure conditions for a critical area, e.g., a higher resolution placement, a two pass exposure, full process and/or exposure corrections and longer settling times. In contrast, the e-beam tool may write region 510 with one or more exposure conditions for a non-critical area, e.g., lower resolution, a larger spot size, a single pass exposure, simplistic corrections and/or shorter settle times.

As shown in FIG. 7, the non-critical region 510 includes regions 515, which are a multiple of the shot size. That is, regions 515 are four times larger than the shot size 520 (shown in FIG. 6). As such, in writing the non-critical regions 515, no half shots or quarter shots are necessary. Additionally, in accordance with aspects of the invention, in embodiments, a larger spot size may be used to write regions 515. For example, a spot size that is four times the shot size 520 (as shown in FIG. 6) may be used to write regions 515, with other spot sizes contemplated by the invention. In contrast, critical regions 510 are smaller than the shot size 520. As such, in writing these critical features, the e-beam tool may utilize, for example, half shots and quarter shots, as well as a multi-pass approach.

Additionally, as shown in FIG. 7, by implementing the present invention, a lower shot (or spot) counts may be realized, which results in reduced costs. That is, with this example, writing the exemplary photomask 500 utilizes eighty-eight shots=(sixteen×one pass)+(thirty-six×two passes). In contrast, with this example, using an approach wherein each feature of the photomask is created with the same level exposure conditions would require one-hundred-sixty-two shots=(eighty-one×two passes). Thus, by implementing the present invention, the number of shots necessary to produce the photomask has been reduced from one-hundred-sixty-two shots to eighty-eight shots, or a forty-six percent reduction in number of shots. Moreover, the reduction in number of shots results in a quicker photomask formation and reduced costs. Additionally, the present invention contemplates that the number of shots may be reduced by a greater or lesser amount, for example, depending upon the photomask size, the shot sizes utilized and/or the relative sizes of the non-critical and critical regions.

System Environment

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electro-magnetic, infrared, or semiconductor system, apparatus, device, or propagation medium. More specific examples (a non-exhaustive list) of the computer-readable medium would include the following:

- an electrical connection having one or more wires,
- a portable computer diskette,
- a hard disk,
- a random access memory (RAM),
- a read-only memory (ROM),
- an erasable programmable read-only memory (EPROM or Flash memory),
- an optical fiber,
- a portable compact disc read-only memory (CDROM),
- an optical storage device,
- a transmission media such as those supporting the Internet or an intranet, or
- a magnetic storage device.

The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network. This may include, for example, a local area network (LAN) or a wide area network (WAN), or the connection may be made to an external computer (for example, through the Internet using an Internet Service Provider).

Figure 8:
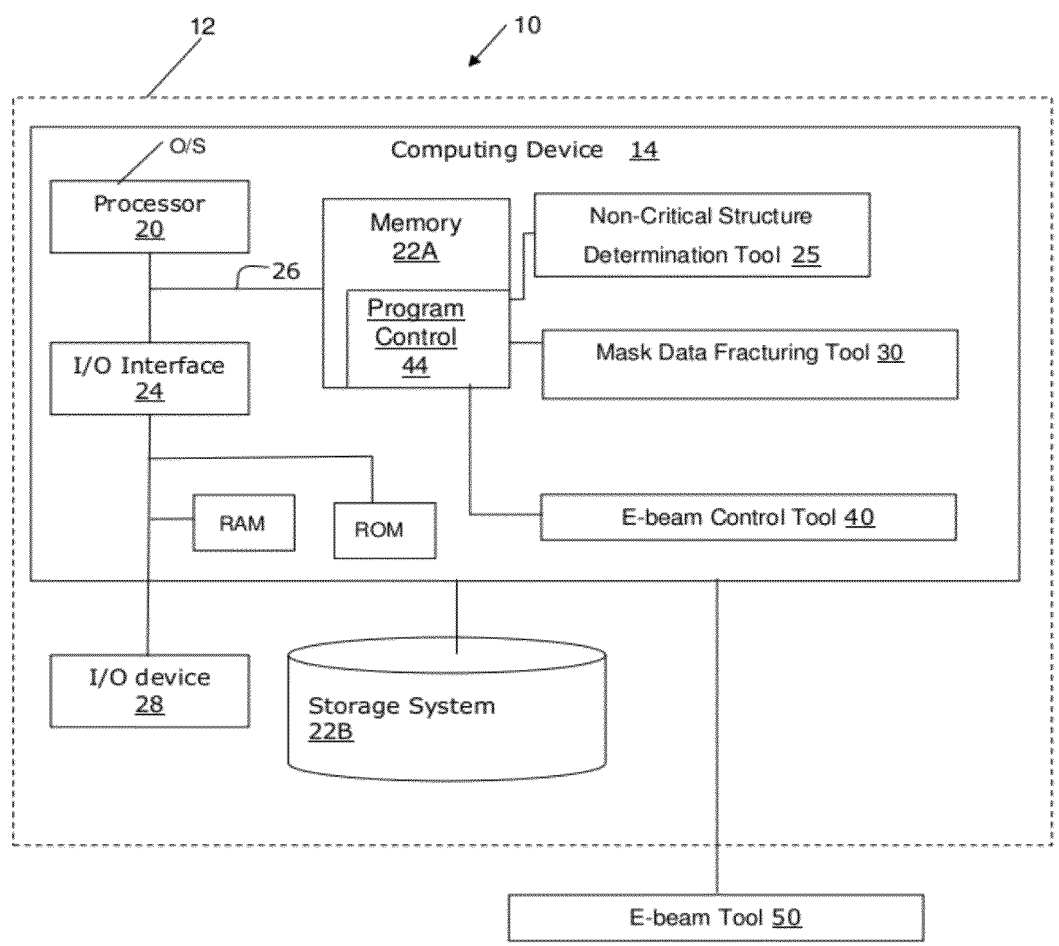
FIG. 8 shows an illustrative environment for managing the processes in accordance with the invention.

FIG. 8 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 8).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device/resource 28 and the storage system 22B. For example, the I/O device 28 can comprise any device that enables an individual to interact with the computing device 14 or any device that enables the computing device 14 to communicate with one or more other computing devices using any type of communications link. The external I/O device/resource 28 may be for example, a handheld device, PDA, handset, keyboard etc. Additionally, the computing device 14 is in communication with a e-beam tool 50. While illustrated in FIG. 8 as external to the computing device 14, in embodiments the invention contemplates that the e-beam tool 50 may be internal to (or integral with) the computing device 14.

In general, the processor 20 executes computer program code (e.g., program control 44), which can be stored in the memory 22A and/or storage system 22B. Moreover, in accordance with aspects of the invention, the program control 44 controls a non-critical shape/structure determination tool 30, a photomask data fracturing tool 35 and an e-beam control tool 40. While executing the computer program code, the processor 20 can read and/or write data to/from memory 22A, storage system 22B, and/or I/O interface 24. The program code executes the processes of the invention. The bus 26 provides a communications link between each of the components in the computing device 14.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

The computing device 14 includes the non-critical shape/structure determination tool 25. The non-critical shape/structure determination tool 25 is operable to receive an a photomask layout and determine those structures or shapes of the photomask layout that are non-critical shapes, (e.g., can be produced using lower tolerances, with larger spot sizes, with shorter settling times and/or with a single pass approach). In embodiments, the non-critical shape/structure determination tool 25 may access a database (e.g., storage system 22B) that lists those structures that are classified as non-critical shapes, in order to identify such non-critical shapes. Additionally, for example, in embodiments, a user may manually identify one or more shapes as non-critical shapes.

The photomask data fracturing tool 30 is operable to fracture photomask data into write shapes that are multiples of the spot size. The e-beam control tool 40 is operable to control the e-beam tool 50 in accordance with the determinations of the non-critical shape/structure determination tool 25 and the photomask data fracturing tool 30 to write the non-critical shapes and the critical shapes of the photomask. That is, the e-beam control tool 40 may direct the e-beam tool 50 to write the non-critical shapes using the time-saving approaches of the present invention, e.g., larger spot sizes, lower tolerance, single passes and/or shorter settling times. Additionally, the e-beam control tool 40 may direct the e-beam tool 50 to write the critical shapes using higher tolerance photomask writing approaches, e.g., smaller spot sizes, multiple-passes and/or increased settling times, e.g., the processes described herein. The non-critical shape/structure determination tool 25, the photomask data fracturing tool 30 and the e-beam control tool 40 can be implemented as one or more program code in the program control 44 stored in memory 22A as separate or combined modules.

The methods as described above are used with a photolithography process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method of printing a photolithographic mask comprising:
fracturing mask design data into write shapes that are multiples of a spot size;
passing fractured mask design data to a write tool; and
writing one or more non-critical shapes according to one or more time-saving rules.

2. The method of claim 1, further comprising identifying the one or more non-critical shapes from the mask design data.

3. The method of claim 1, further comprising writing one or more critical shapes.

4. The method of claim 3, wherein the writing the one or more non-critical shapes is performed subsequent to the writing the one or more critical shapes.

5. The method of claim 1, wherein the write tool comprises an electron beam (e-beam) tool.

6. The method of claim 1, wherein the one or more non-critical shapes comprise at least one of: a fill shape, a pad, a guard ring, a mask bar code, a mask metrology alignment, a phase metrology, a border and a test pad.

7. The method of claim 1, wherein the one or more time-saving rules comprise utilizing at least one of:
a larger spot size;
a lower resolution;
a single pass writing; and
a reduced settling time.

8. The method of claim 1, wherein the method is implemented in a computer infrastructure having computer executable code tangibly embodied on a computer readable storage medium having programming instructions operable to perform at least one of the fracturing, the passing and the writing.

9. The method of claim 1, further comprising writing one or more critical shapes, wherein:
the writing the one or more non-critical shapes comprises using only full size spot sizes of the spot size; and
the writing the one or more critical shapes comprises using half or quarter spot sizes of the spot size.

10. The method of claim 9, wherein the writing the one or more non-critical shapes and the writing the one or more critical shapes are performed in parallel.

11. A system implemented in hardware, comprising:
a non-critical structure determination tool operable to identify one or more non-critical structures in mask design data;
a mask data fracturing tool operable to fracture the mask design data into write shapes that are multiples of a spot size; and
an electron beam (e-beam) control tool operable to pass fractured mask design data to an e-beam tool with instructions to write the one or more non-critical shapes according to one or more time-saving rules.

12. The system of claim 11, further comprising the e-beam tool.

13. The system of claim 11, wherein the e-beam control tool is further operable to pass fractured mask design data to the e-beam tool with instructions to write one or more critical shapes.

14. The system of claim 13, wherein the e-beam control tool is further operable to pass fractured mask design data to the e-beam tool with instructions to write the one or more critical shapes prior to the writing of the one or more non-critical shapes.

15. The system of claim 11, wherein the one or more non-critical shapes comprise at least one of: a fill shape, a pad, a guard ring, a mask bar code, a mask metrology alignment, a phase metrology, a border and a test pad.

16. The system of claim 11, wherein the one or more time-saving rules comprise utilizing at least one of:
a larger spot size;
a lower resolution;
a single pass writing; and
a reduced settling time.

17. A computer program product comprising a computer usable storage medium having readable program code embodied in the storage medium, the computer program product includes at least one component operable to:
fracture mask design data into write shapes that are multiples of a spot size;
identify one or more non-critical shapes from the mask design data;
pass fractured mask design data to an electron beam (e-beam) write tool; and
instruct a writing of the one or more non-critical shapes according to one or more time-saving rules.

18. The computer program product of claim 17, wherein the one or more non-critical shapes comprise at least one of: a fill shape, a pad, a guard ring, a mask bar code, a mask metrology alignment, a phase metrology, a border and a test pad.

19. The computer program product of claim 17, wherein the one or more time-saving rules comprise at least one of:
a larger spot size;
a lower resolution;
a single pass writing; and
a reduced settling time.

20. The computer program product of claim 17, wherein the at least one component is further operable to instruct the writing of one or more critical shapes.

21. The computer program product of claim 20, wherein the at least one component operable to instruct the writing of the one or more non-critical shapes is further operable to instruct the writing of the one or more non-critical shapes subsequent to the writing the one or more critical shapes.

22. The computer program product of claim 17, wherein the at least one component is operable to instruct the e-beam write tool to write the one or more non-critical shapes.

* * * * *